(12) United States Patent  
Wadhwa et al.

(10) Patent No.: US 11,581,878 B1  
(45) Date of Patent: Feb. 14, 2023

(54) LEVEL SHIFTER

(71) Applicant: NXP B.V., Eindhoven (NL)

(72) Inventors: Sanjay Kumar Wadhwa, Noida (IN); Saurabh Goyal, Sonipat (IN); Divya Tripathi, Noida (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/450,403

(22) Filed: Oct. 8, 2021

(51) Int. Cl.
| | |
|---|---|
| *H03K 19/00* | (2006.01) |
| *H03K 19/0175* | (2006.01) |
| *H03K 19/0185* | (2006.01) |
| *H03F 3/45* | (2006.01) |
| *H03K 3/356* | (2006.01) |
| *H03K 17/10* | (2006.01) |
| *H03K 5/156* | (2006.01) |

(52) U.S. Cl.  
CPC ..... *H03K 3/356113* (2013.01); *H03K 5/1565* (2013.01); *H03K 17/102* (2013.01); *H03K 19/018521* (2013.01)

(58) Field of Classification Search  
None  
See application file for complete search history.

(56) References Cited

U.S. PATENT DOCUMENTS

| | | | |
|---|---|---|---|
| 5,682,123 A | 10/1997 | Chau | |
| 5,942,947 A | 8/1999 | Bhagwan | |
| 6,747,497 B2 | 6/2004 | Ingino, Jr. | |
| 7,489,205 B2 | 2/2009 | Chatterjee et al. | |
| 7,737,757 B2 * | 6/2010 | Behrends | H03K 3/356121 326/62 |
| 8,111,088 B2 | 2/2012 | Srivastava et al. | |
| 8,432,189 B1 * | 4/2013 | Malhan | H03K 19/018521 326/80 |
| 8,559,247 B2 * | 10/2013 | Shiu | G11C 7/225 365/189.11 |
| 9,537,476 B1 | 1/2017 | Wadhwa et al. | |
| 9,881,669 B1 * | 1/2018 | Bringivijayaraghavan | G11C 11/418 |
| 10,205,441 B1 * | 2/2019 | Abhishek | H03K 5/003 |
| 10,666,259 B1 * | 5/2020 | Mora | H03K 19/0948 |
| 2021/0050825 A1 * | 2/2021 | Lee | H03F 3/505 |

OTHER PUBLICATIONS

Woorham Bae, "CMOS Inverter as Analog Circuit: An Overview", Journal of Low Power Electronics and Applications, Aug. 20, 2019, MDPI.

* cited by examiner

*Primary Examiner* — Kenneth B Wells

(57) ABSTRACT

A level shifter includes a control circuit and a bias circuit. The control circuit receives a bias voltage, a first signal associated with a first voltage domain, and supply voltages associated with a second voltage domain, and outputs a second signal that is associated with the second voltage domain. The bias circuit generates the bias voltage that is indicative of the duty cycle of the second signal, and provides the bias voltage to the control circuit to control the duty cycle of the second signal. The duty cycle of the second signal is controlled such that a difference between a duty cycle of the first signal and an inverse of the duty cycle of the second signal is less than a tolerance limit.

18 Claims, 7 Drawing Sheets

LEVEL SHIFTER

BACKGROUND

The present disclosure relates generally to electronic circuits, and, more particularly, to a level shifter.

Some integrated circuits typically include various voltage domains. When functional circuits associated with one voltage domain generate signals that are to be utilized by functional circuits associated with a different voltage domain, voltage translation of the signals may be required. To implement the voltage translation between the voltage domains, level shifters are utilized in the integrated circuits. A level shifter receives a signal that is associated with one voltage domain and outputs another signal that is associated with a different voltage domain. In other words, the outputted signal is a level-shifted version of the received signal. Some types of level shifters utilize an amplification circuit and a series of buffers. Such a level shifter, however, distorts a duty cycle of the outputted signal.

SUMMARY

In an embodiment of the present disclosure, a circuit is disclosed. The circuit may include a level shifter. The level shifter may include a control circuit and a bias circuit that may be coupled with the control circuit. The control circuit may be configured to receive a bias voltage, a first signal associated with a first voltage domain, and a first supply voltage and a second supply voltage that are associated with a second voltage domain, and output a second signal associated with the second voltage domain. The bias circuit may be configured to generate the bias voltage that is indicative of a duty cycle of the second signal, and provide the bias voltage to the control circuit. The duty cycle of the second signal is controlled based on the bias voltage such that a difference between a duty cycle of the first signal and an inverse of a duty cycle of the second signal is less than a first tolerance limit associated with the level shifter.

In another embodiment of the present disclosure, a level shifting method is disclosed. The level shifting method may include receiving a bias voltage, a first signal associated with a first voltage domain, and first and second supply voltages associated with a second voltage domain by a control circuit of a level shifter. The level shifting method may further include outputting a second signal associated with the second voltage domain by the control circuit. The second signal may be outputted based on the bias voltage, the first signal, and the first and second supply voltages. Further, the level shifting method may include generating the bias voltage by a bias circuit of the level shifter. The bias voltage may be indicative of a duty cycle of the second signal. The level shifting method may further include providing, by the bias circuit, the bias voltage to the control circuit. The duty cycle of the second signal may be controlled based on the bias voltage such that a difference between a duty cycle of the first signal and an inverse of the duty cycle of the second signal is less than a first tolerance limit associated with the level shifter.

In some embodiments, the control circuit acts as a current-controlled inverter such that a current associated with the control circuit is controlled based on the bias voltage. The control circuit acts as a current-controlled inverter when a difference between the first supply voltage and the bias voltage is greater than or equal to a first threshold value and when a difference between the bias voltage and the second supply voltage is greater than or equal to a second threshold value. When the control circuit acts as the current-controlled inverter, the control circuit outputs the second signal as an inverted level-shifted version of the first signal. Further, the first supply voltage is greater than the second supply voltage.

In some embodiments, the bias circuit may include an integrator that may be configured to integrate a third signal and generate the bias voltage such that the bias voltage is an integrated version of the third signal. The third signal is derived from the second signal.

In some embodiments, the circuit may further include a first functional circuit that may be coupled with the control circuit. The first functional circuit may be configured to receive a third supply voltage and a fourth supply voltage associated with the first voltage domain, and generate the first signal. The first functional circuit may further be configured to provide the first signal to the control circuit.

In some embodiments, the level shifter may further include a set of inverters that may be coupled with the control circuit and the bias circuit. The set of inverters may be configured to receive the second signal, output a third signal such that a voltage range of the third signal is equal to a voltage range of the second signal, and provide the third signal to the bias circuit. The bias circuit generates the bias voltage that is indicative of a duty cycle of the third signal.

In some embodiments, the second signal is an inverted version of the first signal and the third signal has a same logic state as that of the second signal. A difference between the duty cycle of the third signal and the duty cycle of the second signal is less than a second tolerance limit associated with the level shifter.

In some embodiments, the level shifter may further include an inverter that may be coupled with the set of inverters. The inverter may be configured to receive the third signal and output a fourth signal that is an inverted version of the third signal. A voltage range of the fourth signal is equal to the voltage range of the third signal. A difference between a duty cycle of the fourth signal and an inverse of the duty cycle of the third signal is less than a third tolerance limit associated with the level shifter.

In some embodiments, the circuit may further include a second functional circuit that may be coupled with the inverter. The second functional circuit may be configured to receive the fourth signal and the first and second supply voltages and perform a set of functional operations associated therewith.

In some embodiments, the bias circuit may include a resistor and a capacitor that may be configured to integrate a third signal and generate the bias voltage such that the bias voltage is an integrated version of the third signal. The third signal is derived from the second signal. The bias circuit may further include a switch that may be configured to receive a fourth signal. The switch may be activated and deactivated based on activation and deactivation of the fourth signal, respectively. When the switch is activated, the bias circuit provides the bias voltage to the control circuit.

In some embodiments, the switch may be coupled between the resistor and the capacitor.

In some embodiments, the switch may be coupled between the capacitor and the control circuit.

In some embodiments, the control circuit may include a first transistor, a second transistor, a third transistor, and a fourth transistor. The first transistor has a first terminal, a second terminal, and a third terminal. The first terminal of the first transistor may be configured to receive the first supply voltage. The second terminal of the first transistor may be coupled with the bias circuit. The second terminal of the first transistor may be configured to receive the bias voltage from the bias circuit. The second transistor has a first terminal that may be coupled with the third terminal of the first transistor and a second terminal that may be configured to receive the first signal. Further, the second transistor has a third terminal that may be configured to output the second signal. The third transistor has a first terminal, a second terminal, and a third terminal. The second terminal of the third transistor may be coupled with the second terminal of the first transistor, and the third terminal of the third transistor may be coupled with the third terminal of the second transistor. The fourth transistor has a first terminal that may be configured to receive the second supply voltage and a second terminal that may be coupled with the second terminal of the second transistor. Further, the fourth transistor has a third terminal that may be coupled with the first terminal of the third transistor. The first supply voltage is greater than the second supply voltage.

In some embodiments, the first transistor is deactivated when the bias voltage is equal to the first supply voltage, and the first transistor is activated when the difference between the first supply voltage and the bias voltage is greater than or equal to a first threshold value. The third transistor is deactivated when the bias voltage is equal to the second supply voltage, and the third transistor is activated when the difference between the bias voltage and the second supply voltage is greater than or equal to a second threshold value.

In some embodiments, when the first and third transistors are activated, a drive strength of the first transistor and a drive strength of the third transistor are controlled based on the bias voltage such that the difference between the duty cycle of the first signal and the inverse of the duty cycle of the second signal is less than the first tolerance limit.

In some embodiments, the level shifter may further include a fifth transistor that has a first terminal configured to receive the first supply voltage and a second terminal configured to receive a third signal. An operation of the level shifter is controlled based on the third signal. The fifth transistor further has a third terminal that may be coupled with the bias circuit and the second terminals of the first and third transistors. The fifth transistor is activated and deactivated based on deactivation and activation of the third signal, respectively.

In some embodiments, when the fifth transistor is activated, the bias voltage is equal to the first supply voltage, the first transistor is deactivated, and the third transistor is activated. When the fifth transistor is deactivated, the bias voltage reduces such that the first transistor is activated when the difference between the first supply voltage and the bias voltage is greater than or equal to a first threshold value. When the first and third transistors are activated, the control circuit acts as a current-controlled inverter and outputs the second signal as an inverted level-shifted version of the first signal.

In some embodiments, when the fifth transistor is activated, the bias voltage is equal to the first supply voltage, the first transistor is deactivated, and the third transistor is activated. When the fifth transistor is deactivated, the bias voltage is equal to the second supply voltage, the third transistor is deactivated, and the first transistor is activated. When the fifth transistor remains deactivated, the bias voltage increases such that the third transistor is activated when the difference between the bias voltage and the second supply voltage is greater than or equal to a second threshold value. When the first and third transistors are activated, the control circuit acts as a current-controlled inverter and outputs the second signal as an inverted level-shifted version of the first signal.

In some embodiments, the level shifter may further include a sixth transistor that has a first terminal configured to receive the second supply voltage and a second terminal configured to receive a fourth signal that is an inverted version of the third signal. The sixth transistor further has a third terminal that may be coupled with the third terminal of the second transistor. The third terminal of the sixth transistor may be configured to receive the second signal from the third terminal of the second transistor. Based on activation of the fourth signal, the sixth transistor is activated and the second signal is pulled down to the second supply voltage. Further, based on deactivation of the fourth signal, the sixth transistor is deactivated.

Various embodiments of the present disclosure disclose a level shifter. The level shifter may include a control circuit, a set of inverters, a bias circuit, and another inverter. The control circuit receives a bias voltage, a first signal that is associated with a first voltage domain, and supply voltages associated with a second voltage domain, and outputs a second signal. The second signal is an inverted level-shifted version of the first signal. A difference between a duty cycle of the first signal and an inverse of a duty cycle of the second signal is less than a first tolerance limit associated with the level shifter.

The set of inverters receives the second signal and outputs a third signal. A voltage range of the third signal is equal to a voltage range of the second signal. Further, the third signal has a same logic state as that of the second signal. A difference between the duty cycle of the second signal and a duty cycle of the third signal is less than a second tolerance limit associated with the level shifter. The bias circuit receives the third signal, generates the bias voltage that is indicative of the duty cycle of the third signal, and provides the bias voltage to the control circuit such that the duty cycle of the second signal is controlled based on the bias voltage. Further, the inverter receives the third signal and outputs a fourth signal that is an inverted version of the third signal. A difference between a duty cycle of the fourth signal and an inverse of the duty cycle of the third signal is less than a third tolerance limit associated with the level shifter. A voltage range of the fourth signal is equal to the voltage range of the third signal. The fourth signal is provided to a functional circuit associated with the second voltage domain. The functional circuit performs various functional operations based on the fourth signal.

Thus, the level shifter translates the first signal to the fourth signal such that the fourth signal is the level-shifted version of the first signal, and has a same logic state as that of the first signal. In the level shifter of the present disclosure, the control circuit is biased based on the bias voltage such that a difference between the duty cycle of the first signal and the duty cycle of the fourth signal is less than a fourth tolerance limit, i.e., a sum of the first through third tolerance limits. Thus, the distortion of the duty cycle of the fourth signal is reduced. A conventional level shifter that reduces duty cycle distortion consumes a significant current, and in turn, a significant power. In the level shifter of the present disclosure, the bias voltage controls the control circuit such that the creation of a direct current path between a power supply and a ground terminal is prevented. Hence, a current in the level shifter of the present disclosure is significantly less than that in the conventional level shifter. Consequently, a power consumed by the level shifter of the present disclosure is significantly less than a power consumed by the conventional level shifter.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
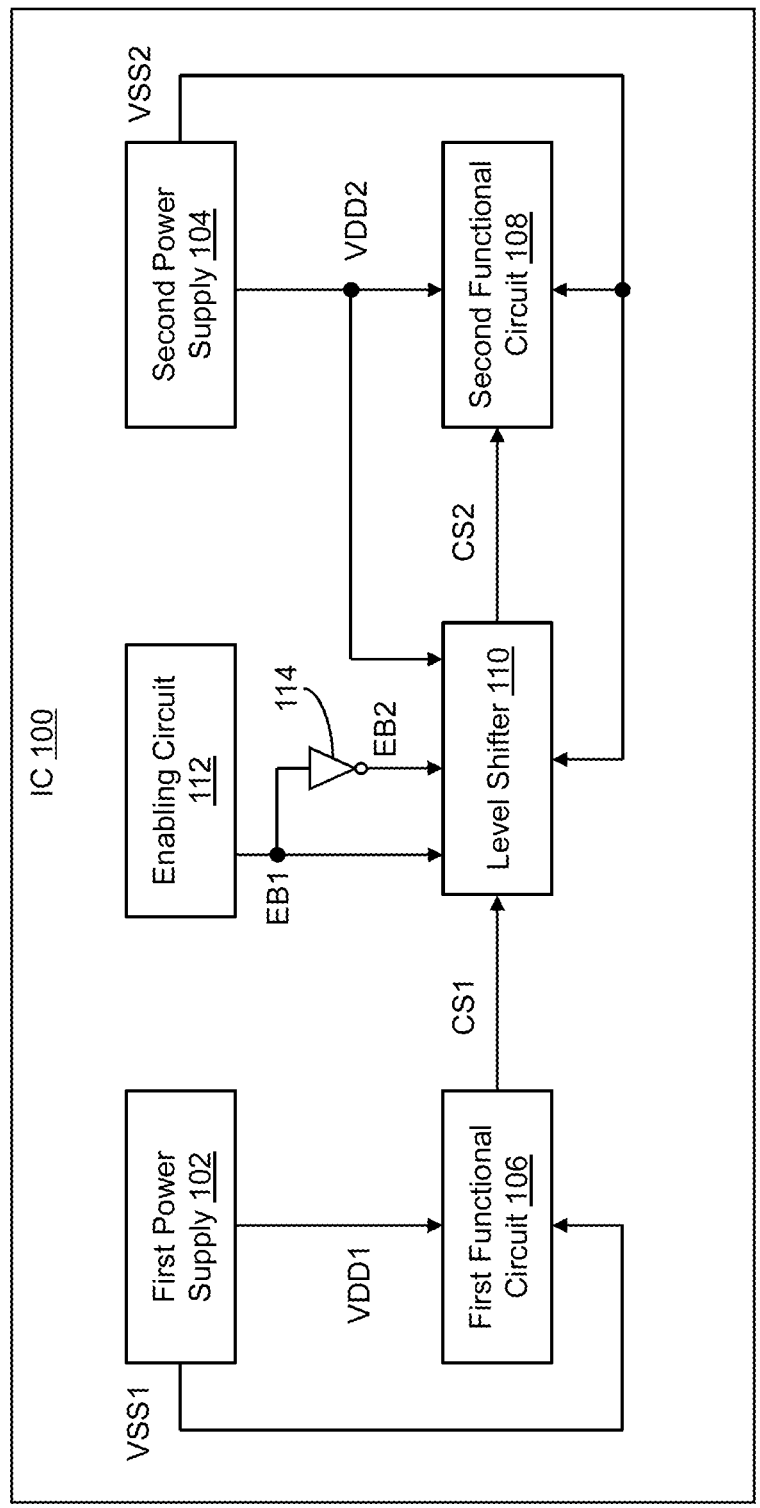
FIG. 1 illustrates a schematic block diagram of an integrated circuit (IC) in accordance with an embodiment of the present disclosure.

FIG. 1 illustrates a schematic block diagram of an integrated circuit (IC) 100 in accordance with an embodiment of the present disclosure. The IC 100 may include a first power supply 102 that may be configured to generate a first supply voltage VDD1 and a second supply voltage VSS1. The first supply voltage VDD1 and the second supply voltage VSS1 are associated with a first voltage domain. The first supply voltage VDD1 is greater than the second supply voltage VSS1. Further, the IC 100 may include a second power supply 104 that may be configured to generate a third supply voltage VDD2 and a fourth supply voltage VSS2. The third supply voltage VDD2 and the fourth supply voltage VSS2 are associated with a second voltage domain. The third supply voltage VDD2 is greater than the fourth supply voltage VSS2.

Although FIG. 1 illustrates that the IC 100 may include the first and second power supplies 102 and 104, the scope of the present disclosure is not limited to it. In an alternate embodiment, the first and second power supplies 102 and 104 may be external to the IC 100, without deviating from the scope of the present disclosure.

A voltage range of the first voltage domain (i.e., a difference between the first and second supply voltages VDD1 and VSS1) is different than a voltage range of the second voltage domain (i.e., a difference between the third and fourth supply voltages VDD2 and VSS2). In an embodiment, the voltage range of the first voltage domain is less than the voltage range of the second voltage domain. In another embodiment, the voltage range of the first voltage domain is greater than the voltage range of the second voltage domain. Further, the second and fourth supply voltages VSS1 and VSS2 may be equal to a ground voltage (i.e., 0 volts). However, the scope of the present disclosure is not limited to the second and fourth supply voltages VSS1 and VSS2 being equal to the ground voltage. In various other embodiments, one or both of the second and fourth supply voltages VSS1 and VSS2 may be less than the ground voltage (e.g., −1 volt), without deviating from the scope of the present disclosure. The IC 100 may further include a first functional circuit 106, a second functional circuit 108, and a level shifter 110.

The first functional circuit 106 may be coupled with the first power supply 102, and the second functional circuit 108 may be coupled with the second power supply 104. The first and second functional circuits 106 and 108 are thus associated with the first and second voltage domains, respectively. In other words, the first and second functional circuits 106 and 108 operate in the first and second voltage domains, respectively.

The first and second functional circuits 106 and 108 include suitable circuitry configured to perform one or more operations. For example, the first functional circuit 106 may be configured to receive the first and second supply voltages VDD1 and VSS1 from the first power supply 102. Similarly, the second functional circuit 108 may be configured to receive the third and fourth supply voltages VDD2 and VSS2 from the second power supply 104. Based on the first and second supply voltages VDD1 and VSS1, the first functional circuit 106 may be further configured to generate a first signal CS1 having a first duty cycle. The first signal CS1 is hereinafter referred to as a "first control signal CS1". The second functional circuit 108 may be configured to receive a second signal CS2 that is a level-shifted version of the first control signal CS1 (i.e., associated with the second voltage domain). The second signal CS2 is hereinafter referred to as a "second control signal CS2". In such a scenario, the second control signal CS2 has a second duty cycle.

A difference between the first duty cycle (i.e., a duty cycle of the first control signal CS1) and the second duty cycle (i.e., a duty cycle of the second control signal CS2) is less than a first tolerance limit associated with the level shifter 110. In an example, the first tolerance limit is equal to 5 percent. However, the first tolerance limit may have other values in other embodiments. Based on the second control signal CS2 and the third and fourth supply voltages VDD2 and VSS2, the second functional circuit 108 may be further configured to perform a set of functional operations associated therewith. Examples of the first and second functional circuits 106 and 108 may include oscillators, analog-to-digital converters, processors, digital logic circuits, or the like.

The level shifter 110 may be coupled between the first functional circuit 106 and the second functional circuit 108. Further, the level shifter 110 may be coupled with the second power supply 104. The level shifter 110 may be configured to receive the first control signal CS1 from the first functional circuit 106 and the third and fourth supply voltages VDD2 and VSS2 from the second power supply 104. Based on the first control signal CS1 and the third and fourth supply voltages VDD2 and VSS2, the level shifter 110 may be further configured to output the second control signal CS2. The second control signal CS2 is thus associated with the second voltage domain. In other words, the second control signal CS2 is the level-shifted version of the first control signal CS1. In an embodiment, a voltage range of the first control signal CS1 is less than a voltage range of the second control signal CS2. In another embodiment, the voltage range of the first control signal CS1 is greater than the voltage range of the second control signal CS2. For the sake of ongoing discussion, it is assumed that the voltage range of the first control signal CS1 is less than the voltage range of the second control signal CS2. Further, the difference between the first and second duty cycles is less than the first tolerance limit. Additionally, a logic state of the first control signal CS1 is same as that of the second control signal CS2 (i.e., the first and second control signals CS1 and CS2 are in phase with each other).

The level shifter 110 may be further configured to receive a third signal EB1 and a fourth signal EB2. The third signal EB1 is hereinafter referred to as a "first enable signal EB1" and the fourth signal EB2 is hereinafter referred to as a "second enable signal EB2". An operation of the level shifter 110 is controlled based on the first enable signal EB1. Further, the second enable signal EB2 is an inverted version of the first enable signal EB1. When the first enable signal EB1 is deactivated (e.g., is at a logic low state) and the second enable signal EB2 is activated (e.g., is at a logic high state), the level shifter 110 is deactivated (i.e., the level shifter 110 is non-operational). When the first enable signal EB1 is activated (e.g., is at a logic high state) and the second enable signal EB2 is deactivated (e.g., is at a logic low state), the level shifter 110 is activated (i.e., the level shifter 110 is operational). When the level shifter 110 is operational, the second control signal CS2 is the level-shifted version of the first control signal CS1. The level shifter 110 is explained in detail in conjunction with FIGS. 2-7.

The IC 100 may further include an enabling circuit 112 and a first inverter 114. The enabling circuit 112 may be coupled with the level shifter 110. The enabling circuit 112 may include suitable circuitry that may be configured to perform one or more operations. For example, the enabling circuit 112 may be configured to generate the first enable signal EB1 and provide the first enable signal EB1 to the level shifter 110 to control the operation of the level shifter 110. The first inverter 114 may be coupled between the enabling circuit 112 and the level shifter 110. The first inverter 114 may be configured to receive the first enable signal EB1 from the enabling circuit 112 and output the second enable signal EB2 such that the second enable signal EB2 is the inverted version of the first enable signal EB1. Further, the first inverter 114 may be configured to provide the second enable signal EB2 to the level shifter 110.

Figure 2:
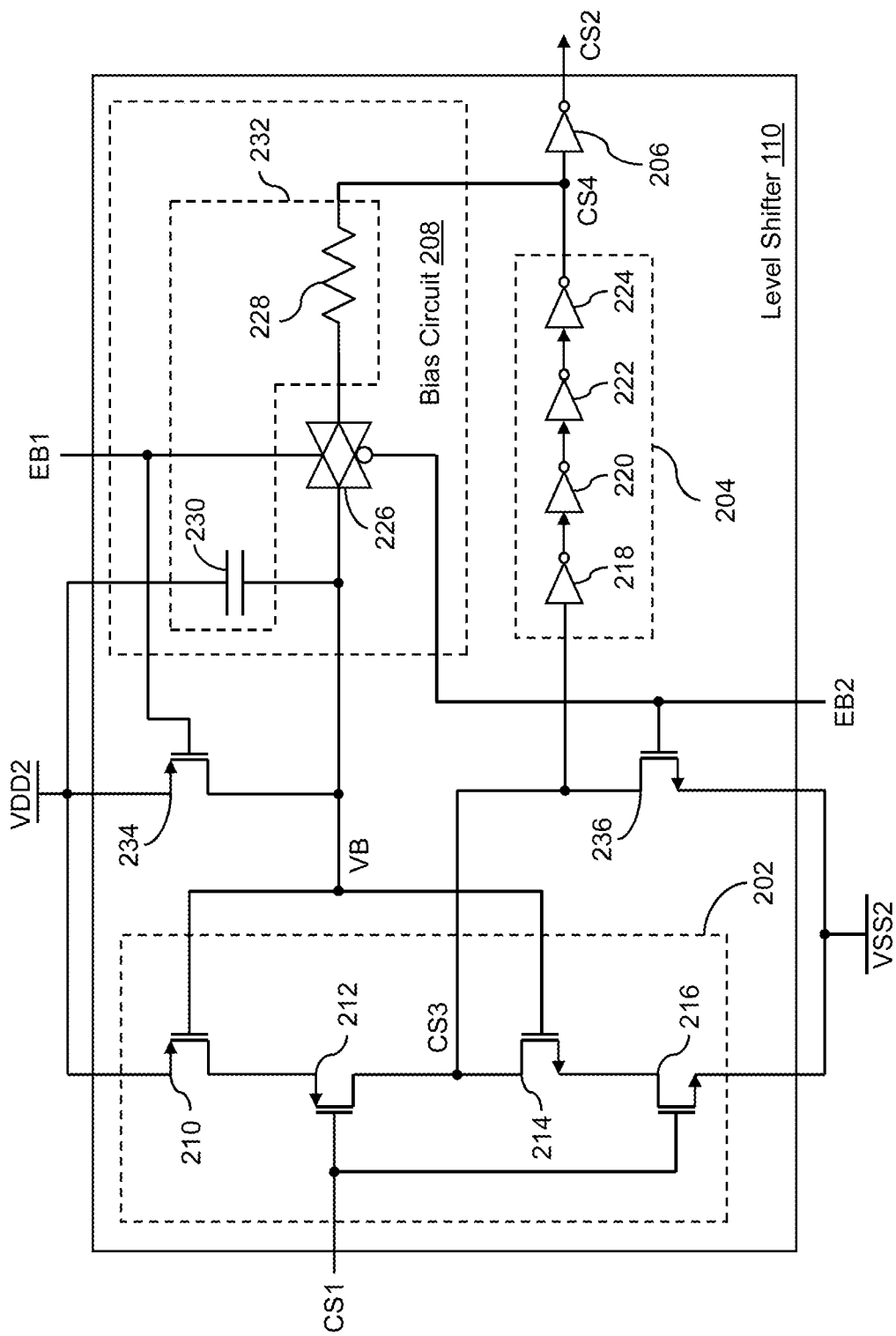
FIG. 2 illustrates a schematic circuit diagram of a level shifter of the IC of FIG. 1 in accordance with an embodiment of the present disclosure.

FIG. 2 illustrates a schematic circuit diagram of the level shifter 110 in accordance with an embodiment of the present disclosure. The level shifter 110 may include a control circuit 202, a set of inverters 204, a second inverter 206, and a bias circuit 208.

The control circuit 202 may be coupled with the second power supply 104, the bias circuit 208, and the first functional circuit 106 that is associated with the first voltage domain. The control circuit 202 may be configured to receive the first control signal CS1 from the first functional circuit 106. In other words, the first functional circuit 106 may be configured to provide the first control signal CS1 to the control circuit 202. The first control signal CS1 has the first duty cycle and is associated with the first voltage domain. Further, the control circuit 202 may be configured to receive a bias voltage VB from the bias circuit 208, and the third and fourth supply voltages VDD2 and VSS2 from the second power supply 104. Based on the first control signal CS1, the bias voltage VB, and the third and fourth supply voltages VDD2 and VSS2, the control circuit 202 may be further configured to output a fifth signal CS3. The fifth signal CS3 is hereinafter referred to as a "third control signal CS3".

The third control signal CS3 has a third duty cycle and is an inverted version of the first control signal CS1. Further, a difference between the first duty cycle and an inverse of the third duty cycle (i.e., a duty cycle of the third control signal CS3) is less than a second tolerance limit associated with the level shifter 110. In an example, the second tolerance limit is equal to 4.95 percent. However, the second tolerance limit may have other values in other embodiments. Additionally, a voltage range of the third control signal CS3 is different than the voltage range of the first control signal CS1. In an embodiment, the voltage range of the first control signal CS1 is less than the voltage range of the third control signal CS3. In another embodiment, the voltage range of the first control signal CS1 is greater than the voltage range of the third control signal CS3. For the sake of ongoing discussion, it is assumed that the voltage range of the first control signal CS1 is less than the voltage range of the third control signal CS3. Thus, the third control signal CS3 is the inverted level-shifted version of the first control signal CS1.

The control circuit 202 may include a first transistor 210, a second transistor 212, a third transistor 214, and a fourth transistor 216. The first transistor 210 has a first terminal, a second terminal, and a third terminal. The first terminal of the first transistor 210 may be coupled with the second power supply 104 and the second terminal of the first transistor 210 may be coupled with the bias circuit 208. The first terminal of the first transistor 210 may be configured to receive the third supply voltage VDD2 from the second power supply 104. Further, the second terminal of the first transistor 210 may be configured to receive the bias voltage VB from the bias circuit 208. In an embodiment, the first transistor 210 is a p-channel metal-oxide semiconductor (PMOS) transistor, and the first through third terminals of the first transistor 210 correspond to source, gate, and drain terminals, respectively.

The second transistor 212 has a first terminal, a second terminal, and a third terminal. The first terminal of the second transistor 212 may be coupled with the third terminal of the first transistor 210. The second terminal of the second transistor 212 may be coupled with the first functional circuit 106. The second terminal of the second transistor 212 may be configured to receive the first control signal CS1 from the first functional circuit 106. Further, the third terminal of the second transistor 212 may be configured to output the third control signal CS3. In an embodiment, the second transistor 212 is a PMOS transistor, and the first through third terminals of the second transistor 212 correspond to source, gate, and drain terminals, respectively.

The first transistor 210 is thus deactivated when the bias voltage VB is equal to the third supply voltage VDD2. Conversely, the first transistor 210 is activated when the difference between the third supply voltage VDD2 and the bias voltage VB is greater than or equal to a first threshold value. In an example, the first threshold value is equal to a threshold voltage of the first transistor 210. However, the first threshold value may have other values in other embodiments. Further, the second transistor 212 is activated when the first control signal CS1 is deactivated (e.g., is at a logic low state). The second transistor 212 remains activated when the first control signal CS1 is activated (e.g., is at a logic high state) until a difference between a voltage level of the first control signal CS1 and a drain voltage (i.e., a voltage level at the third terminal) of the first transistor 210 is greater than or equal to a second threshold value. Further, the second transistor 212 is deactivated when the difference between the voltage level of the first control signal CS1 and the drain voltage of the first transistor 210 is less than the second threshold value. In an example, the second threshold value is equal to a threshold voltage of the second transistor 212. However, the second threshold value may have other values in other embodiments.

The third transistor 214 has a first terminal, a second terminal, and a third terminal. The second terminal of the third transistor 214 may be coupled with the second terminal of the first transistor 210 and the bias circuit 208. Thus, the second terminal of the third transistor 214 may be configured to receive the bias voltage VB. Further, the third terminal of the third transistor 214 may be coupled with the third terminal of the second transistor 212 to output the third control signal CS3. In an embodiment, the third transistor 214 is an n-channel metal-oxide semiconductor (NMOS) transistor, and the first through third terminals of the third transistor 214 correspond to source, gate, and drain terminals, respectively.

The fourth transistor 216 has a first terminal, a second terminal, and a third terminal. The first terminal of the fourth transistor 216 may be coupled with the second power supply 104. The first terminal of the fourth transistor 216 may be configured to receive the fourth supply voltage VSS2. The second terminal of the fourth transistor 216 may be coupled with the second terminal of the second transistor 212 and the first functional circuit 106. Thus, the second terminal of the fourth transistor 216 may be configured to receive the first control signal CS1. Further, the third terminal of the fourth transistor 216 may be coupled with the first terminal of the third transistor 214. In an embodiment, the fourth transistor 216 is an NMOS transistor, and the first through third terminals of the fourth transistor 216 correspond to source, gate, and drain terminals, respectively.

The third transistor 214 is thus activated when a difference between the bias voltage VB and the fourth supply voltage VSS2 is greater than or equal to a third threshold value. Conversely, the third transistor 214 is deactivated when the difference between the bias voltage VB and the fourth supply voltage VSS2 is less than the third threshold value. In an example, the third threshold value is equal to a sum of a threshold voltage of the third transistor 214 and a voltage drop across the fourth transistor 216. However, the third threshold value may have other values in other embodiments. Further, the fourth transistor 216 is activated when the first control signal CS1 is activated (e.g., is at a logic high state). Conversely, the fourth transistor 216 is deactivated when the first control signal CS1 is deactivated (e.g., is at a logic low state).

Thus, when the bias voltage VB is equal to the third supply voltage VDD2, the first transistor 210 is deactivated, and when the bias voltage VB is equal to the fourth supply voltage VSS2, the third transistor 214 is deactivated. The bias voltage VB thus controls the first and third transistors 210 and 214. When the bias voltage VB is at such a voltage level that a difference between the third supply voltage VDD2 and the bias voltage VB is greater than or equal to the first threshold value and a difference between the bias voltage VB and the fourth supply voltage VSS2 is greater than or equal to the third threshold value, both the first and third transistors 210 and 214 are activated. Upon activation, the drive strengths of the first and third transistors 210 and 214 are controlled based on the bias voltage VB. The bias voltage VB thus controls a current associated with the control circuit 202 (i.e., a current passing through the first through fourth transistors 210-218). In other words, the control circuit 202 acts as a current-controlled inverter when the first and third transistors 210 and 214 are activated.

The scope of the present disclosure is not limited to the control circuit 202 as illustrated in FIG. 2 (i.e., including the first through fourth transistors 210-216 arranged as illustrated in FIG. 2). In various other embodiments, more than or less than four transistors arranged in various other configurations may be implemented as the control circuit 202, without deviating from the scope of the present disclosure.

The set of inverters 204 may be coupled with the control circuit 202 (i.e., the third terminals of the second and third transistors 212 and 214). The set of inverters 204 may be configured to receive the third control signal CS3 from the control circuit 202 (i.e., the third terminals of the second and third transistors 212 and 214), and output a sixth signal CS4. The sixth signal CS4 is hereinafter referred to as a "fourth control signal CS4". As shown in FIG. 2, the set of inverters 204 may include a third inverter 218, a fourth inverter 220, a fifth inverter 222, and a sixth inverter 224 (i.e., an even number of inverters) that may be coupled in series with each other. Thus, the fourth control signal CS4 has a same logic state as that of the third control signal CS3. Further, the fourth control signal CS4 has a fourth duty cycle. In other words, the fourth control signal CS4 is derived from the third control signal CS3.

Although it is described that the set of inverters 204 may include an even number of inverters that may be coupled in series with each other, the scope of the present disclosure is not limited to it. In an alternate embodiment, the set of inverters 204 may include an odd number of inverters that may be coupled in series with each other, without deviating from the scope of the present disclosure.

A difference between the fourth duty cycle (i.e., a duty cycle of the fourth control signal CS4) and the third duty cycle is less than a third tolerance limit associated with the level shifter 110. In an example, the third tolerance limit is equal to 0.04 percent. However, the third tolerance limit may have other values in other embodiments. Additionally, a voltage range of the fourth control signal CS4 is equal to the voltage range of the third control signal CS3.

Although not illustrated in FIG. 2, the third, fourth, fifth, and sixth inverters 218, 220, 222, and 224 may further be configured to receive the third and fourth supply voltages VDD2 and VSS2 at supply terminals thereof for performing the corresponding inverting operations.

The second inverter 206 may be coupled with the set of inverters 204 (i.e., the sixth inverter 224) and the second functional circuit 108 that is associated with the second voltage domain. The second inverter 206 may be configured to receive the fourth control signal CS4 from the set of inverters 204 (i.e., the sixth inverter 224), and output the second control signal CS2. The second control signal CS2 is an inverted version of the fourth control signal CS4 and has a same voltage range as that of the fourth control signal CS4. A difference between the second duty cycle and an inverse of the fourth duty cycle is less than a fourth tolerance limit associated with the level shifter 110. In an example, the fourth tolerance limit is equal to 0.01 percent. However, the fourth tolerance limit may have other values in other embodiments. The second inverter 206 may be further configured to provide the second control signal CS2 to the second functional circuit 108.

Although not illustrated in FIG. 2, the second inverter 206 may be further configured to receive the third and fourth supply voltages VDD2 and VSS2 at supply terminals thereof for performing the corresponding inverting operation.

The second control signal CS2 is an inverted version of the fourth control signal CS4 and has a same voltage range as that of the fourth control signal CS4. The fourth control signal CS4 has a same logic state and a same voltage range as that of the third control signal CS3. Further, the third control signal CS3 is the inverted level-shifted version of the first control signal CS1. Hence, the second control signal CS2 has a same logic state as that of the first control signal CS1 and is the level-shifted version of the first control signal CS1.

The difference between the second duty cycle and the inverse of the fourth duty cycle is less than the fourth tolerance limit. The difference between the third and fourth duty cycles is less than the third tolerance limit. In other words, the difference between the inverse of the third duty cycle and the inverse of the fourth duty cycle is less than the third tolerance limit. Further, the difference between the first duty cycle and the inverse of the third duty cycle is less than the second tolerance limit. Thus, the difference between the first duty cycle and the second duty cycle is less than the first tolerance limit, where the first tolerance limit is equal to a sum of the second, third, and fourth tolerance limits (e.g., 4.95 percent+0.04 percent+0.01 percent=5 percent).

Although FIG. 2 illustrates that the level shifter 110 may include the second inverter 206 for outputting the second control signal CS2 that has a same logic state as that of the first control signal CS1, the scope of the present disclosure is not limited to it. In various other embodiments, the level shifter 110 may include an even number of inverters instead of the second inverter 206 to output the second control signal CS2 such that the second control signal CS2 is the inverted version of the first control signal CS1, without deviating from the scope of the present disclosure. Alternatively, the second inverter 206 may be omitted from the level shifter 110 and the fourth control signal CS4 outputted by the set of inverters 204 may be provided to the second functional circuit 108, without deviating from the scope of the present disclosure.

The bias circuit 208 may be coupled with the second power supply 104, the enabling circuit 112, the first inverter 114, the set of inverters 204 (i.e., the sixth inverter 224), and the control circuit 202 (i.e., the second terminals of the first and third transistors 210 and 214). The bias circuit 208 may be configured to receive the third supply voltage VDD2 and the fourth control signal CS4 from the second power supply 104 and the set of inverters 204 (i.e., the sixth inverter 224), respectively. Further, the bias circuit 208 may be configured to receive the first and second enable signals EB1 and EB2 from the enabling circuit 112 and the first inverter 114, respectively. Based on the first and second enable signals EB1 and EB2, the third supply voltage VDD2, and the fourth control signal CS4, the bias circuit 208 may be further configured to generate the bias voltage VB. The bias voltage VB is indicative of the fourth duty cycle of the fourth control signal CS4, and in turn, of the third duty cycle of the third control signal CS3. Further, the bias circuit 208 may be configured to provide the bias voltage VB to the control circuit 202 (i.e., the second terminals of the first and third transistors 210 and 214). The bias voltage VB controls the operation of the control circuit 202. In other words, the third duty cycle of the third control signal CS3 is controlled based on the bias voltage VB such that the difference between the first duty cycle and the inverse of the third duty cycle is less than the second tolerance limit.

The bias circuit 208 may include a switch 226, a resistor 228, and a capacitor 230. As shown in FIG. 2, the switch 226 corresponds to a transmission gate. However, various other circuits (e.g., a transistor) may be implemented as the switch 226 in other embodiments. The switch 226 has a first data terminal that may be coupled with the resistor 228 and a second data terminal that may be coupled with the capacitor 230. In other words, the switch 226 may be coupled between the resistor 228 and the capacitor 230. Further, the switch 226 has a first control terminal that may be coupled with the enabling circuit 112 and a second control terminal that may be coupled with the first inverter 114. The first and second control terminals of the switch 226 may be configured to receive the first and second enable signals EB1 and EB2 from the enabling circuit 112 and the first inverter 114, respectively. In an embodiment, the switch 226 is deactivated (i.e., open) when the first enable signal EB1 is deactivated (e.g., is at a logic low state). Conversely, the switch 226 is activated (i.e., closed) when the first enable signal EB1 is activated (e.g., is at a logic high state). In other words, the switch 226 is activated and deactivated based on the activation and deactivation of the first enable signal EB1, respectively.

The resistor 228 has a first terminal that may be coupled with the set of inverters 204 (i.e., the sixth inverter 224). The first terminal of the resistor 228 may be configured to receive the fourth control signal CS4. The resistor 228 further has a second terminal that may be coupled with the first data terminal of the switch 226. The capacitor 230 has a first terminal that may be coupled with the second power supply 104. The first terminal of the capacitor 230 may be configured to receive the third supply voltage VDD2 from the second power supply 104. The capacitor 230 further has a second terminal that may be coupled with the control circuit 202 (i.e., the second terminals of the first and third transistors 210 and 214) and the second data terminal of the switch 226. When the switch 226 is activated, the resistor 228 and the capacitor 230 may be configured to integrate the fourth control signal CS4 and generate the bias voltage VB. In other words, when the switch 226 is activated, the resistor 228 and the capacitor 230 act as an integrator 232. The integrator 232 may thus include the resistor 228 and the capacitor 230. Further, the integrator 232 may be configured to integrate the fourth control signal CS4, when the switch 226 is activated, based on the third supply voltage VDD2 and generate the bias voltage VB. The bias voltage VB is an integrated version of the fourth control signal CS4. In other words, the bias voltage VB is a product of the third supply voltage VDD2 and the fourth duty cycle of the fourth control signal CS4. The bias circuit 208 further provides the bias voltage VB to the control circuit 202 (i.e., the second terminals of the first and third transistors 210 and 214) by way of the second terminal of the capacitor 230.

It will be apparent to a person skilled in the art that the scope of the disclosure is not limited to the integrator 232 being implemented by way of the resistor 228 and the capacitor 230 as illustrated in FIG. 2. In various other embodiments, the integrator 232 may be implemented by way of various other circuits, without deviating from the scope of the present disclosure.

Although FIG. 2 illustrates that the first terminal of the capacitor 230 receives the third supply voltage VDD2 from the second power supply 104, the scope of the present disclosure is not limited to it. In various other embodiments, the first terminal of the capacitor 230 may alternatively receive the fourth supply voltage VSS2 from the second power supply 104, without deviating from the scope of the present disclosure. Further, it will be apparent to a person skilled in the art that the scope of the present disclosure is not limited to the switch 226 being coupled between the capacitor 230 and the resistor 228. In an alternate embodiment, the switch 226 may be coupled between the resistor 228 and the set of inverters 204, without deviating from the scope of the present disclosure. In such a scenario, the operations of the bias circuit 208 remain same as described above.

The level shifter 110 may further include a fifth transistor 234 that has a first terminal, a second terminal, and a third terminal. The first terminal of the fifth transistor 234 may be coupled with the second power supply 104 and the second terminal of the fifth transistor 234 may be coupled with the enabling circuit 112. The first terminal of the fifth transistor 234 may be configured to receive the third supply voltage VDD2 from the second power supply 104. The second terminal of the fifth transistor 234 may be configured to receive the first enable signal EB1 from the enabling circuit 112. Further, the third terminal of the fifth transistor 234 may be coupled with the control circuit 202 (i.e., the second terminals of the first and third transistors 210 and 214) and the bias circuit 208 (i.e., the second terminal of the capacitor 230). In an embodiment, the fifth transistor 234 is a PMOS transistor, and the first through third terminals of the fifth transistor 234 correspond to source, gate, and drain terminals, respectively. The fifth transistor 234 is thus deactivated and activated when the first enable signal EB1 is activated (e.g., is at a logic high state) and deactivated (e.g., is at a logic low state), respectively. In other words, the fifth transistor 234 is activated and deactivated based on the deactivation and activation of the first enable signal EB1, respectively. When the fifth transistor 234 is activated, the bias voltage VB is equal to the third supply voltage VDD2.

The level shifter 110 may further include a sixth transistor 236 that has a first terminal, a second terminal, and a third terminal. The first terminal of the sixth transistor 236 may be coupled with the second power supply 104 and the second terminal of the sixth transistor 236 may be coupled with the first inverter 114. Thus, the first terminal of the sixth transistor 236 may be configured to receive the fourth supply voltage VSS2 from the second power supply 104, and the second terminal of the sixth transistor 236 may be configured to receive the second enable signal EB2 from the first inverter 114. Further, the third terminal of the sixth transistor 236 may be coupled with the third terminal of the second transistor 212. The third terminal of the sixth transistor 236 may be configured to receive the third control signal CS3 from the third terminal of the second transistor 212. In an embodiment, the sixth transistor 236 is an NMOS transistor, and the first through third terminals of the sixth transistor 236 correspond to source, gate, and drain terminals, respectively. Thus, when the second enable signal EB2 is deactivated (e.g., is at a logic low state), the sixth transistor 236 is deactivated. Further, when the second enable signal EB2 is activated (e.g., is at a logic high state), the sixth transistor 236 is activated. In other words, the sixth transistor 236 is activated and deactivated based on the activation and deactivation of the second enable signal EB2, respectively. When the sixth transistor 236 is activated, the third control signal CS3 is pulled down to the fourth supply voltage VSS2.

In operation, when the first enable signal EB1 is deactivated (e.g., is at a logic low state), the fifth and sixth transistors 234 and 236 are activated and the switch 226 is deactivated. Thus, the third control signal CS3 is pulled down to the fourth supply voltage VSS2 and the level shifter 110 is deactivated. In an embodiment, when the level shifter 110 is deactivated, the second functional circuit 108 discards the received second control signal CS2 (i.e., the second control signal CS2 is not utilized for performing the set of functional operations). Further, as the fifth transistor 234 is activated, the bias voltage VB is equal to the third supply voltage VDD2 and the capacitor 230 is charged to the third supply voltage VDD2. Hence, the first transistor 210 is deactivated and the third transistor 214 is activated.

When the first enable signal EB1 transitions from the deactivated state to an activated state (e.g., from a logic low state to a logic high state), the fifth and sixth transistors 234 and 236 are deactivated and the switch 226 is activated. The bias voltage VB remains equal to the third supply voltage VDD2 due to the charged capacitor 230. As the bias voltage VB is equal to the third supply voltage VDD2, the first transistor 210 remains deactivated and the third transistor 214 remains activated. In such a scenario, when the first control signal CS1 is both deactivated (e.g., is at a logic low state) and activated (e.g., is at a logic high state), the third control signal CS3 remains deactivated (e.g., remains at a logic low state). Further, the set of inverters 204 output the fourth control signal CS4 having a same logic state as that of the third control signal CS3. Thus, the fourth control signal CS4 is deactivated (e.g., is at a logic low state).

When the fourth control signal CS4 is deactivated, the bias voltage VB drains by way of the switch 226, the resistor 228, and the sixth inverter 224. As a result, the bias voltage VB reduces, thereby increasing a magnitude of a gate-to-source voltage of the first transistor 210 (i.e., increasing the drive strength of the first transistor 210). The bias voltage VB reduces with each cycle associated with the first control signal CS1. The first transistor 210 is thus activated when the difference between the bias voltage VB and the third supply voltage VDD2 is equal to the first threshold value (e.g., the threshold voltage of the first transistor 210). The third transistor 214 remains activated at such a time instance.

When the first and third transistors 210 and 214 are activated, the control circuit 202 acts as a current-controlled inverter such that the current associated with the control circuit 202 is controlled based on the bias voltage VB. When the control circuit 202 acts as the current-controlled inverter, the control circuit 202 outputs the third control signal CS3 as the inverted level-shifted version of the first control signal CS1. The bias voltage VB further reduces (i.e., the difference between the bias voltage VB and the third supply voltage VDD2 is greater than the first threshold value) before settling to within a voltage range that ensures the difference between the first duty cycle and the inverse of the third duty cycle is less than the second tolerance limit. In other words, the bias voltage VB and a negative feedback configuration of the control circuit 202, the set of inverters 204, and the bias circuit 208 thus ensure that the difference between the first duty cycle and the second duty cycle is less than the first tolerance limit. In an example, the first duty cycle and the second duty cycle are equal. Further, the second inverter 206 outputs and provides the second control signal CS2 to the second functional circuit 108. In such a scenario, the third duty cycle, and in turn, the second duty cycle, is controlled by way of the bias voltage VB.

The negative feedback configuration of the control circuit 202, the set of inverters 204, and the bias circuit 208 further track process-voltage-temperature (PVT) variations associated with the IC 100 and the variations in the first control signal CS1. The variations in the first control signal CS1 may include variations in a frequency of the first control signal CS1, the first duty cycle, or the like.

The bias voltage VB is modified based on the PVT variations and the variations in the first control signal CS1. For example, if the first duty cycle increases, the third duty cycle decreases, thereby leading to a decrease in the bias voltage VB. As a result, the drive strength of the first transistor 210 increases and the drive strength of the third transistor 214 decreases which in turn lead to an increase in the third duty cycle. The afore-mentioned operations continue for various cycles of the first control signal CS1 before the bias voltage VB settles to within a voltage range that ensures the difference between the first duty cycle and the inverse of the third duty cycle is less than the second tolerance limit. Conversely, if the first duty cycle decreases, the third duty cycle increases, thereby leading to an increase in the bias voltage VB. As a result, the drive strength of the first transistor 210 decreases and the drive strength of the third transistor 214 increases which in turn lead to a decrease in the third duty cycle. The afore-mentioned operations continue for various cycles of the first control signal CS1 before the bias voltage VB settles to within a voltage range that ensures the difference between the first duty cycle and the inverse of the third duty cycle is less than the second tolerance limit. The bias voltage VB may similarly be modified based on the PVT variations in the first control signal CS1. This ensures that the PVT variations associated with the IC 100 and the variations in the first control signal CS1 do not distort the third duty cycle of the third control signal CS3, and in turn, the second duty cycle of the second control signal CS2.

The supply noise associated with the second power supply 104 is regulated by way of the capacitor 230. For example, when the third supply voltage VDD2 increases, the capacitor 230 couples the second terminal of the first transistor 210 to the first terminal of the first transistor 210, thereby ensuring that the drive strength of the first transistor 210 remains unchanged. Thus, the capacitor 230 ensures that the supply noise associated with the second power supply 104 does not distort the second duty cycle of the second control signal CS2.

The bias voltage VB ensures that a drive strength of the first transistor 210 is less than that when the second terminal of the first transistor 210 is at the fourth supply voltage VSS2. Further, when the first control signal CS1 is activated (e.g., is at a logic high state), the third terminal (i.e., the drain terminal) of the first transistor 210 is at such a voltage level that the drive strength of the first transistor 210 further decreases, thereby leading to the deactivation of the first transistor 210. Additionally, the fourth transistor 216 is deactivated when the first control signal CS1 is deactivated (e.g., is at a logic low state). Thus, the creation of a direct current path between two terminals of the second power supply 104 that provide the third and fourth supply voltages VDD2 and VSS2, respectively, is prevented.

Figure 3:
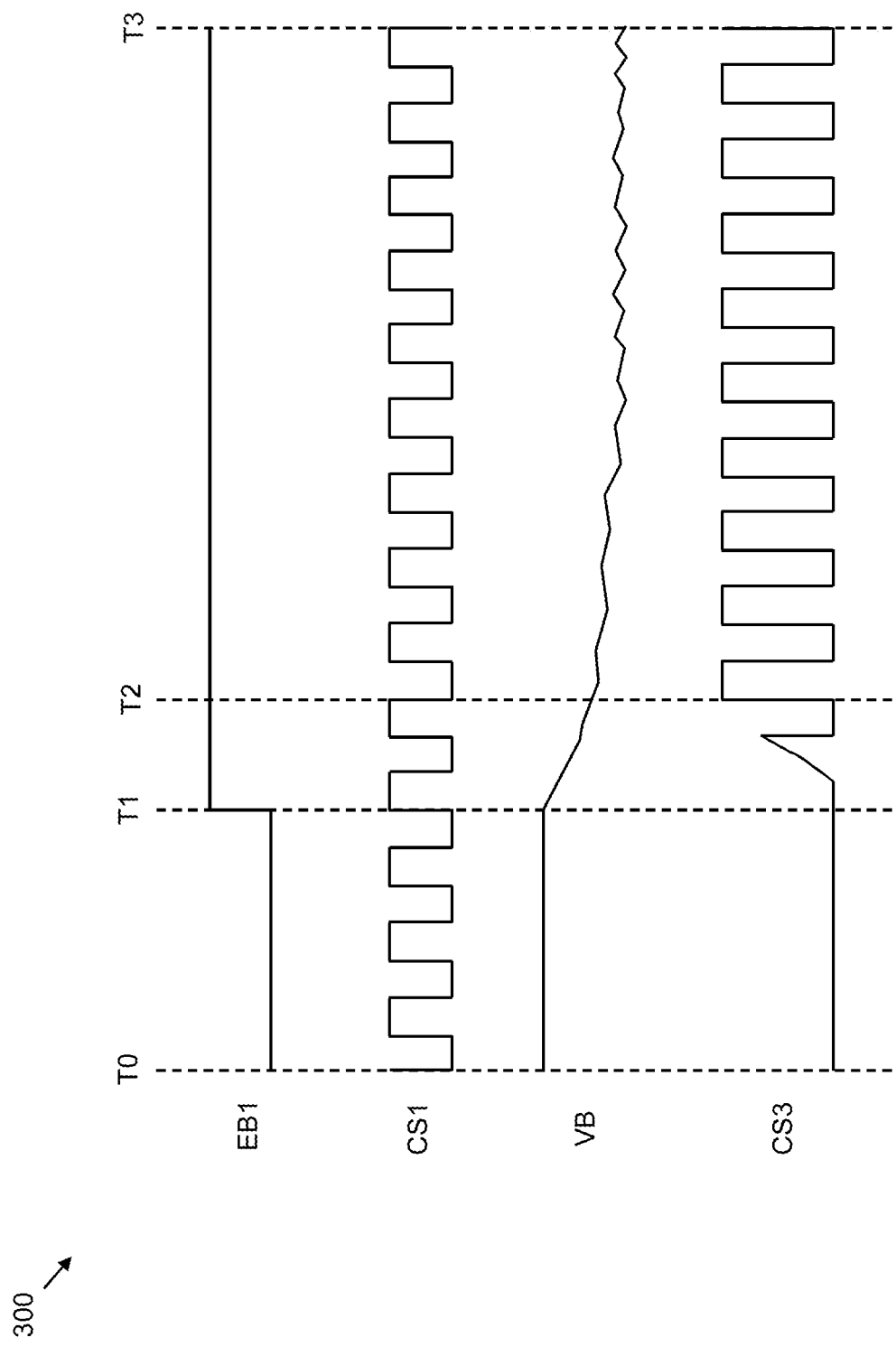
FIG. 3 represents a timing diagram that illustrates an operation of the level shifter of the IC of FIG. 1 in accordance with an embodiment of the present disclosure.

FIG. 3 represents a timing diagram 300 that illustrates an operation of the level shifter 110 in accordance with an embodiment of the present disclosure. The level shifter 110 receives the first and second enable signals EB1 and EB2 from the enabling circuit 112 and the first inverter 114, respectively. Further, the level shifter 110 receives the first control signal CS1 and the third supply voltage VDD2 from the first functional circuit 106 and the second power supply 104, respectively.

During a time period T0-T1, the first enable signal EB1 is at a logic low state. As the first enable signal EB1 is at a logic low state, the fifth and sixth transistors 234 and 236 are activated and the switch 226 is deactivated. Thus, the bias voltage VB is equal to the third supply voltage VDD2, and the third control signal CS3 is at a logic low state (i.e., is pulled down to the fourth supply voltage VSS2). The first control signal CS1 toggles between a logic low state and a logic high state during the time period T0-T1. Alternatively, the first control signal CS1 may gradually increase during the time period T0-T1.

At time instance T1, the first enable signal EB1 transitions from a logic low state to a logic high state. Thus, the fifth and sixth transistors 234 and 236 are deactivated and the switch 226 is activated. At the time instance T1, the bias voltage VB remains equal to the third supply voltage VDD2. Hence, the first transistor 210 remains deactivated and the third control signal CS3 remains at a logic low state. The first control signal CS1 continues toggling, and transitions from a logic low state to a logic high state at the time instance T1.

During a time period T1-T2, the first enable signal EB1 remains at a logic high state. Thus, the fifth and sixth transistors 234 and 236 remain deactivated and the switch 226 remains activated. The bias voltage VB reduces as the bias voltage VB drains by way of the switch 226, the resistor 228, and the sixth inverter 224. During the time period T1-T2, the first transistor 210 is partially activated (i.e., a leakage current is outputted by the first transistor 210). Hence, the third control signal CS3 experiences a spike during the time period T1-T2.

At time instance T2, the first control signal CS1 transitions from a logic high state to a logic low state. Further, the bias voltage VB reduces such that the difference between the bias voltage VB and the third supply voltage VDD2 is equal to the first threshold value. Thus, the first transistor 210 is activated. Hence, the third control signal CS3 is the inverted version of the first control signal CS1. In other words, the third control signal CS3 transitions from a logic low state to a logic high state. Additionally, the third control signal CS3 is the level-shifted version of the first control signal CS1. For example, as shown in FIG. 3, the voltage range of the third control signal CS3 is greater than the voltage range of the first control signal CS1. Further, the first enable signal EB1 remains at a logic high state.

During a time period T2-T3, the first enable signal EB1 remains at a logic high state. Thus, the fifth andسسsixth transistors 234 and 236 remain deactivated and the switch 226 remains activated. The bias voltage VB further reduces with each cycle associated with the first control signal CS1 before settling to within a voltage range that ensures the difference between the first duty cycle and the second duty cycle is less than the first tolerance limit. Further, the first and third control signals CS1 and CS3 toggle between a logic low state and a logic high state such that the third control signal CS3 is the inverted version of the first control signal CS1.

Figure 4:
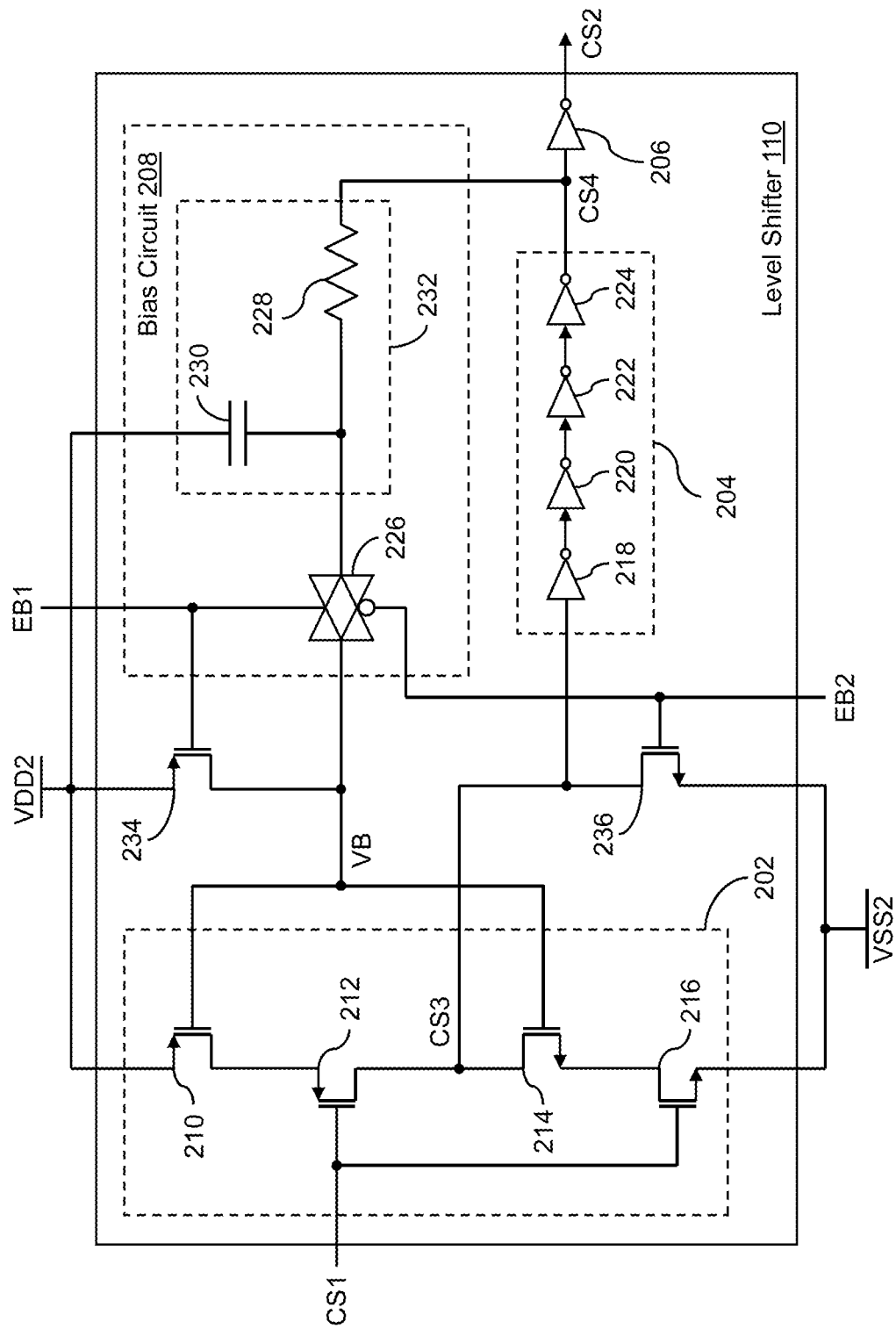
FIG. 4 illustrates a schematic circuit diagram of the level shifter of the IC of FIG. 1 in accordance with another embodiment of the present disclosure.

FIG. 4 illustrates a schematic circuit diagram of the level shifter 110 in accordance with another embodiment of the present disclosure. The level shifter 110 may include the control circuit 202, the set of inverters 204, the second inverter 206, the bias circuit 208, the fifth transistor 234, and the sixth transistor 236. The bias circuit 208 may include the switch 226, the resistor 228, and the capacitor 230.

The structure of the control circuit 202, the set of inverters 204, the second inverter 206, the fifth transistor 234, and the sixth transistor 236 remain same as described in FIG. 2. The difference between the level shifter of FIG. 2 and the level shifter of FIG. 4 is the structure and the functionality of the bias circuit 208. In the bias circuit 208 of FIG. 4, the switch 226 may be coupled between the control circuit 202 and the capacitor 230. The change in the structure of the bias circuit 208 further leads to a change in the operation of the level shifter 110 illustrated in FIG. 4.

The resistor 228 has a first terminal that may be coupled with the set of inverters 204 (i.e., the sixth inverter 224). The first terminal of the resistor 228 may be configured to receive the fourth control signal CS4 from the set of inverters 204 (i.e., the sixth inverter 224). The resistor 228 further has a second terminal that may be coupled with the first data terminal of the switch 226. The capacitor 230 has a first terminal that may be coupled with the second power supply 104. The first terminal of the capacitor 230 may be configured to receive the third supply voltage VDD2 from the second power supply 104. The capacitor 230 further has a second terminal that may be coupled with the second terminal of the resistor 228 and the first data terminal of the switch 226. The resistor 228 and the capacitor 230 may be configured to integrate the fourth control signal CS4 and generate the bias voltage VB. In other words, the resistor 228 and the capacitor 230 act as the integrator 232. Thus, the integrator 232 may include the resistor 228 and the capacitor 230. Further, the integrator 232 may be configured to integrate the fourth control signal CS4 based on the third supply voltage VDD2 and generate the bias voltage VB. The bias voltage VB is the integrated version of the fourth control signal CS4. In other words, the bias voltage VB is a product of the third supply voltage VDD2 and the fourth duty cycle of the fourth control signal CS4.

It will be apparent to a person skilled in the art that the scope of the disclosure is not limited to the integrator 232 being implemented by way of the resistor 228 and the capacitor 230 as illustrated in FIG. 4. In various other embodiments, the integrator 232 may be implemented by way of various other circuits, without deviating from the scope of the present disclosure.

Although FIG. 4 illustrates that the first terminal of the capacitor 230 receives the third supply voltage VDD2 from the second power supply 104, the scope of the present disclosure is not limited to it. In various other embodiments, the first terminal of the capacitor 230 may alternatively receive the fourth supply voltage VSS2 from the second power supply 104, without deviating from the scope of the present disclosure.

As shown in FIG. 4, the switch 226 corresponds to a transmission gate. However, various other circuits (e.g., a transistor) may be implemented as the switch 226 in other embodiments. The switch 226 has a first data terminal that may be coupled with the second terminals of the resistor 228 and the capacitor 230. The first data terminal of the switch 226 may be configured to receive the bias voltage VB from the second terminals of the resistor 228 and the capacitor 230. The switch 226 further has a second data terminal that may be coupled with the control circuit 202 (i.e., the second terminals of the first and third transistors 210 and 214). The switch 226 may thus be coupled between the integrator 232 (i.e., the capacitor 230) and the control circuit 202. Further, the switch 226 has a first control terminal that may be coupled with the enabling circuit 112 and a second control terminal that may be coupled with the first inverter 114. The first and second control terminals of the switch 226 may be configured to receive the first and second enable signals EB1 and EB2 from the enabling circuit 112 and the first inverter 114, respectively. When the switch 226 is activated, the second data terminal of the switch 226 may be configured to provide the bias voltage VB to the control circuit 202 (i.e., the second terminals of the first and third transistors 210 and 214). In other words, the bias circuit 208 provides the bias voltage VB to the control circuit 202 (i.e., the second terminals of the first and third transistors 210 and 214) by way of the second data terminal of the switch 226.

In operation, when the first enable signal EB1 is deactivated (e.g., is at a logic low state), the fifth and sixth transistors 234 and 236 are activated and the switch 226 is deactivated. Thus, the third control signal CS3 is pulled down to the fourth supply voltage VSS2 and the level shifter 110 is deactivated. In an embodiment, when the level shifter 110 is deactivated, the second functional circuit 108 discards the received second control signal CS2 (i.e., the second control signal CS2 is not utilized for performing the set of functional operations). Further, as the fifth transistor 234 is activated, the bias voltage VB is equal to the third supply voltage VDD2. Hence, the first transistor 210 is deactivated and the third transistor 214 is activated. Further, as the switch 226 is deactivated, the capacitor 230 is not charged to the third supply voltage VDD2.

When the first enable signal EB1 transitions from the deactivated state to the activated state (e.g., from a logic low state to a logic high state), the fifth and sixth transistors 234 and 236 are deactivated and the switch 226 is activated. When the switch 226 is activated, the bias voltage VB is pulled down to the fourth supply voltage VSS2 by way of the switch 226, the resistor 228, and the sixth inverter 224. Thus, the first transistor 210 is activated and the third transistor 214 is deactivated. As the bias voltage VB is equal to the fourth supply voltage VSS2, the drain voltage of the first transistor 210 is equal to the third supply voltage VDD2. For the sake of ongoing discussion, it is assumed that the voltage range of the first control signal CS1 is significantly less than that of the second voltage domain. Thus, a difference between the voltage level of the first control signal CS1 and the drain voltage of the first transistor 210 is greater than the second threshold value. Hence, the third control signal CS3 is activated (e.g., is at a logic high state) even when the first control signal CS1 is activated (e.g., is at a logic high state). The third control signal CS3 is also activated when the first control signal CS1 is deactivated (e.g., is at a logic low state). In other words, the second transistor 212 is activated for both the activation and deactivation of the first control signal CS1. Further, the set of inverters 204 output the fourth control signal CS4 having a same logic state as that of the third control signal CS3. Thus, the fourth control signal CS4 is activated (e.g., is at a logic high state).

As the fourth control signal CS4 remains activated (i.e., as the fifth transistor 234 remains deactivated), the bias voltage VB increases, thereby increasing the magnitude of the gate-to-source voltage of the third transistor 214 (i.e., increasing the drive strength of the third transistor 214). The bias voltage VB increases with each cycle associated with the first control signal CS1. The third transistor 214 is thus activated when the difference between the bias voltage VB and the fourth supply voltage VSS2 is equal to the third threshold value. The first transistor 210 remains activated at such a time instance.

When the first and third transistors 210 and 214 are activated, the control circuit 202 acts as a current-controlled inverter such that the current associated with the control circuit 202 is controlled based on the bias voltage VB. When the control circuit 202 acts as the current-controlled inverter, the control circuit 202 outputs the third control signal CS3 as the inverted level-shifted version of the first control signal CS1. The bias voltage VB further increases (i.e., the difference between the bias voltage VB and the fourth supply voltage VSS2 is greater than the third threshold value) before settling to within a voltage range that ensures the difference between the first duty cycle and the inverse of the third duty cycle is less than the second tolerance limit.

Figure 5:
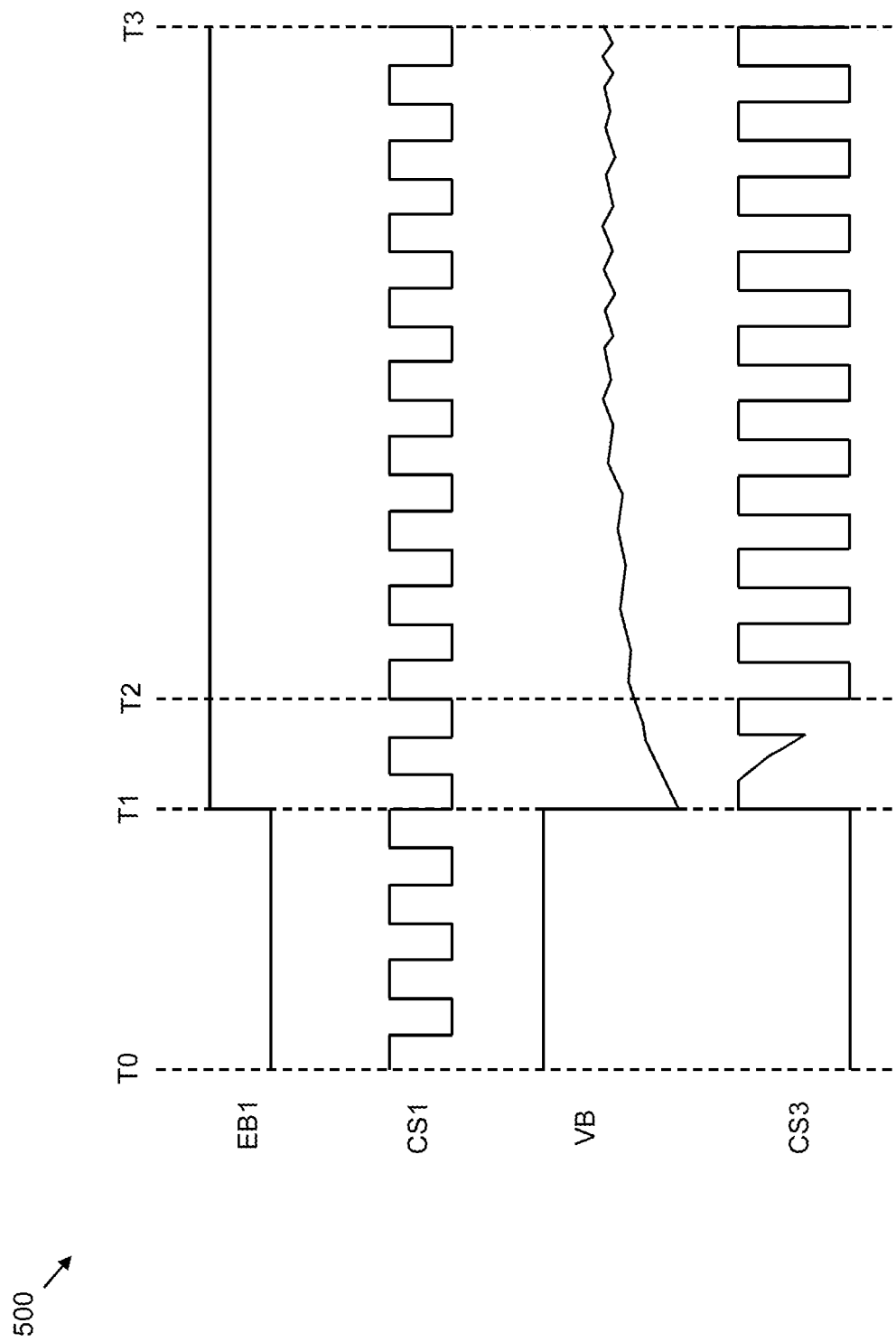
FIG. 5 represents a timing diagram that illustrates the operation of the level shifter of the IC of FIG. 1 in accordance with another embodiment of the present disclosure.

FIG. 5 represents a timing diagram 500 that illustrates the operation of the level shifter 110 in accordance with another embodiment of the present disclosure. The level shifter 110 receives the first and second enable signals EB1 and EB2 from the enabling circuit 112 and the first inverter 114, respectively. Further, the level shifter 110 receives the first control signal CS1 from the first functional circuit 106 and the third and fourth supply voltages VDD2 and VSS2 from the second power supply 104.

During a time period T0-T1, the first enable signal EB1 is at a logic low state. As the first enable signal EB1 is at a logic low state, the fifth and sixth transistors 234 and 236 are activated and the switch 226 is deactivated. Thus, the bias voltage VB is equal to the third supply voltage VDD2, and the third control signal CS3 is at a logic low state (i.e., is pulled down to the fourth supply voltage VSS2). The first control signal CS1 toggles between a logic low state and a logic high state during the time period T0-T1. Alternatively, the first control signal CS1 may gradually increase during the time period T0-T1.

At time instance T1, the first enable signal EB1 transitions from a logic low state to a logic high state. Thus, the fifth and sixth transistors 234 and 236 are deactivated and the switch 226 is activated. At the time instance T1, the bias voltage VB is pulled down to the fourth supply voltage VSS2 by way of the switch 226, the resistor 228, and the sixth inverter 224. Hence, the first transistor 210 is activated and the third transistor 214 is deactivated. As the first transistor 210 is activated, the first terminal (i.e., the source terminal) of the second transistor 212 is at a voltage level that is equal to the third supply voltage VDD2. For the sake of ongoing discussion, it is assumed that a voltage range of the first control signal CS1 is significantly less than that of the second domain. Thus, the second transistor 212 is activated for both the activation and deactivation of the first control signal CS1. Hence, the third control signal CS3 transitions from a logic low state to a logic high state. The first control signal CS1 continues toggling, and transitions from a logic high state to a low state at the time instance T1.

During a time period T1-T2, the first enable signal EB1 remains at a logic high state. Thus, the fifth and sixth transistors 234 and 236 remain deactivated and the switch 226 remains activated. The bias voltage VB increases as the capacitor 230 is charged by way of the resistor 228 and the sixth inverter 224. During the time period T1-T2, the third transistor 214 is partially activated (i.e., a leakage current is outputted by the third transistor 214). Hence, the third control signal CS3 experiences a spike during the time period T1-T2.

At time instance T2, the first control signal CS1 transitions from a logic low state to a logic high state. Further, the bias voltage VB increases such that the difference between the bias voltage VB and the fourth supply voltage VSS2 is equal to the third threshold value. Thus, the third transistor 214 is activated. Hence, the third control signal CS3 is the inverted version of the first control signal CS1. In other words, the third control signal CS3 transitions from a logic high state to a logic low state. Additionally, the third control signal CS3 is the level-shifted version of the first control signal CS1. For example, as shown in FIG. 5, the voltage range of the third control signal CS3 is greater than the voltage range of the first control signal CS1. Further, the first enable signal EB1 remains at a logic high state.

During a time period T2-T3, the first enable signal EB1 remains at a logic high state. Thus, the fifth and sixth transistors 234 and 236 remain deactivated and the switch 226 remains activated. The bias voltage VB further increases (i.e., the third transistor 214 remains activated) with each cycle associated with the first control signal CS1 before settling to within a voltage range that ensures the difference between the first duty cycle and the second duty cycle is less than the first tolerance limit. Further, the first and third control signals CS1 and CS3 toggle between a logic low state and a logic high state such that the third control signal CS3 is the inverted version of the first control signal CS1.

Figure 6:
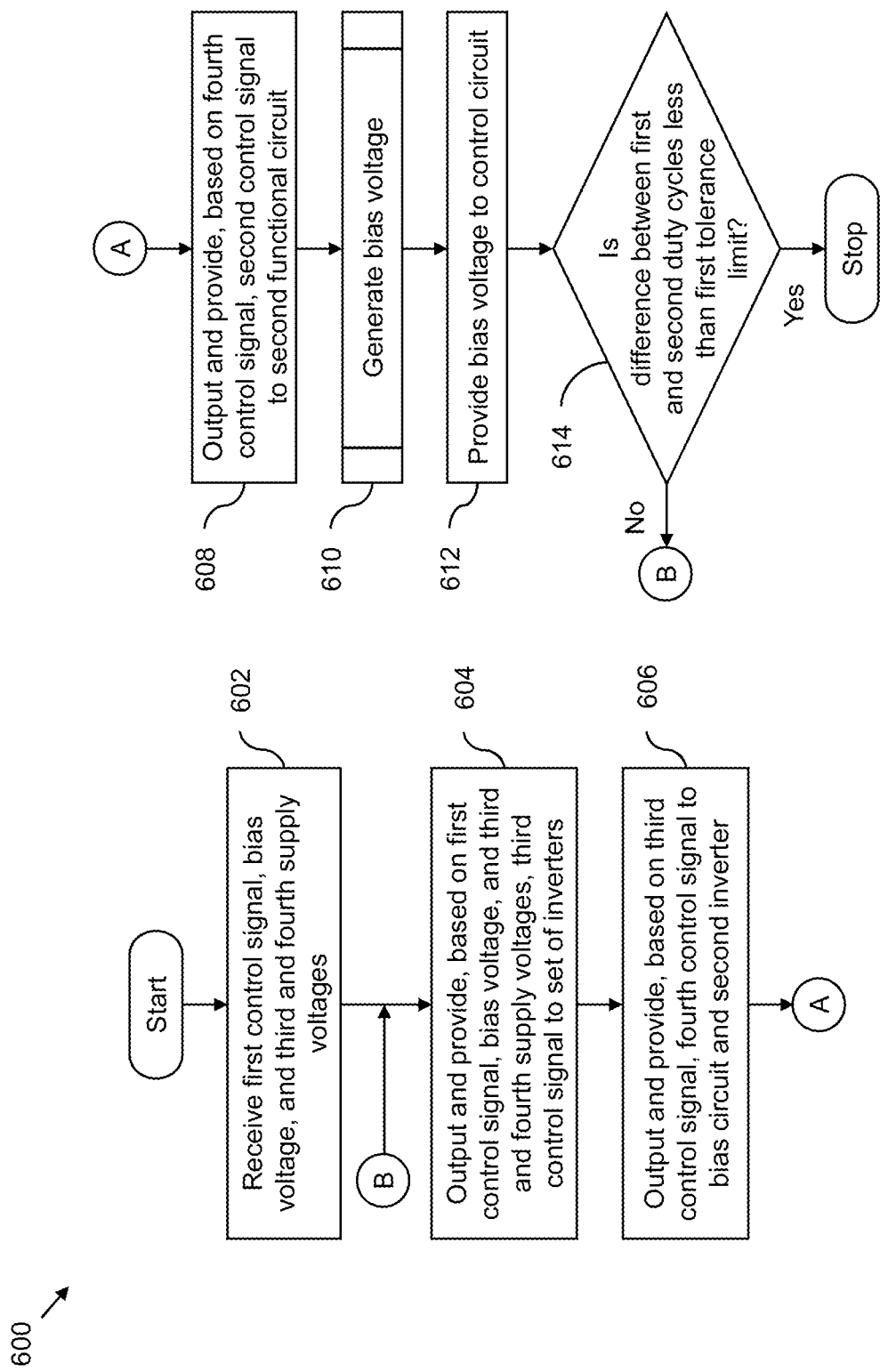
FIGS. 6 and 7, collectively, represents a flowchart that illustrates a level shifting method in accordance with another embodiment of the present disclosure.
Figure 7:
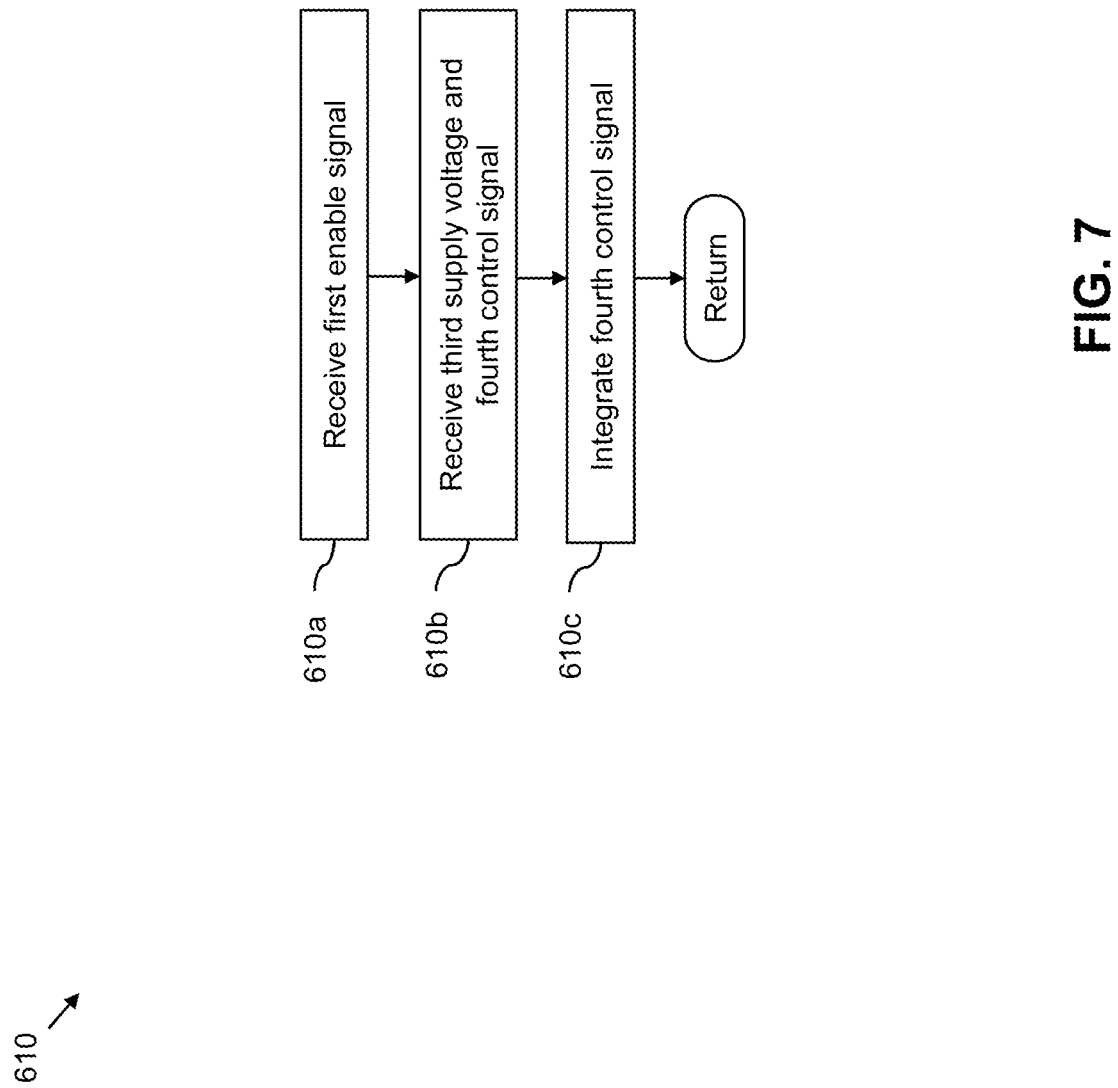

FIGS. 6 and 7, collectively, represent a flowchart 600 that illustrates a level shifting method in accordance with an embodiment of the present disclosure. Referring now to FIG. 6, at step 602, the control circuit 202 receives the first control signal CS1 from the first functional circuit 106, the bias voltage VB from the bias circuit 208, and the third and fourth supply voltages VDD2 and VSS2 from the second power supply 104. At step 604, the control circuit 202 outputs the third control signal CS3 associated with the second voltage domain, and provides the third control signal CS3 to set of inverters 204. The third control signal CS3 is outputted based on the first control signal CS1, the bias voltage VB, and the third and fourth supply voltages VDD2 and VSS2. The third control signal CS3 is the inverted level-shifted version of the first control signal CS1. Further, a difference between the first duty cycle and the inverse of the third duty cycle is less than the second tolerance limit. At step 606, the set of inverters 204 outputs and provides, based on the third control signal CS3, the fourth control signal CS4 to the bias circuit 208 and the second inverter 206. The fourth control signal CS4 has a same voltage range and a same logic state as that of the third control signal CS3. Further, a difference between the third duty cycle and the fourth duty cycle is less than the third tolerance limit.

At step 608, the second inverter 206 outputs and provides, based on the fourth control signal CS4, the second control signal CS2 to the second functional circuit 108. The second control signal CS2 is an inverted version of the fourth control signal CS4 and has a same voltage range as that of the fourth control signal CS4. Further, a difference between the second duty cycle and the inverse of the fourth duty cycle is less than the fourth tolerance limit. Thus, the second control signal CS2 is a level-shifted version of the first control signal CS1 and has a same logic state as that of the first control signal CS1. Further, a difference between the first and second duty cycles is less than the first tolerance limit. At step 610, the bias circuit 208 generates the bias voltage VB.

Referring now to FIG. 7, at step 610a, the switch 226 receives the first enable signal EB1. At step 610b, the integrator 232 (i.e., the capacitor 230 and the resistor 228) receives the third supply voltage VDD2 and the fourth control signal CS4. At step 610c, the integrator 232 integrates the fourth control signal CS4 to generate the bias voltage VB. The bias voltage VB is an integrated version of the fourth control signal CS4.

Referring back to FIG. 6, at step 612, the bias circuit 208 provides the bias voltage VB to the control circuit 202. At step 614, it is determined whether the difference between the first and second duty cycles is less than the first tolerance limit. If at step 614, it is determined that the difference between the first and second duty cycles is greater than or equal to the first tolerance limit, steps 604-614 are repeated.

Thus, the level shifter 110 translates the first control signal CS1 that is associated with the first voltage domain to the second control signal CS2 that is associated with the second voltage domain. In the level shifter 110 of the present disclosure, the control circuit 202 is biased based on the bias voltage VB such that the difference between the first duty cycle of the first control signal CS1 and the second duty cycle of the second control signal CS2 is less than the first tolerance limit. In other words, duty cycle distortion of the second control signal CS2 is reduced.

A conventional level shifter includes a bias circuit having a diode-connected transistor that is coupled with a power supply and another transistor that is coupled between the diode-connected transistor and a ground terminal for reducing duty cycle distortion. The utilization of the diode-connected transistor results in a direct current path between the power supply and the ground terminal when the other transistor is activated. As a result, a current in the conventional level shifter significantly increases, thereby increasing a power consumed by the conventional level shifter.

In the level shifter 110 of the present disclosure, the bias voltage VB controls the first and third transistors 210 and 214 such that when the bias voltage VB is equal to the third supply voltage VDD2, the first transistor 210 is deactivated, and when the bias voltage VB is equal to the fourth supply voltage VSS2, the third transistor 214 is deactivated. Further, when the bias voltage VB is greater than the third and fourth supply voltages VDD2 and VSS2 by at least the first and third threshold values, respectively, the first transistor 210 is deactivated when the first control signal CS1 is activated and the fourth transistor 216 is deactivated when the first control signal CS1 is deactivated. Thus, the creation of a direct current path between the two terminals of the second power supply 104 that provide the third and fourth supply voltages VDD2 and VSS2, respectively, is prevented in the level shifter 110 of the present disclosure. Hence, a current in the level shifter 110 of the present disclosure is significantly less than that in the conventional level shifter. Consequently, a power consumed by the level shifter 110 of the present disclosure is significantly less than a power consumed by the conventional level shifter. Thus, the level shifter 110 of the present disclosure is more efficient as compared to the conventional level shifter.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:
1. A circuit, comprising:
  a level shifter that comprises:
    a control circuit configured to receive (i) a bias voltage, (ii) a first signal associated with a first voltage domain, and (iii) a first supply voltage and a second supply voltage associated with a second voltage domain, and output a second signal associated with the second voltage domain; and
    a bias circuit that is coupled with the control circuit, and configured to generate the bias voltage that is indicative of a duty cycle of the second signal, and provide the bias voltage to the control circuit, wherein the duty cycle of the second signal is controlled based on the bias voltage such that a difference between a duty cycle of the first signal and an inverse of the duty cycle of the second signal is less than a first tolerance limit associated with the level shifter, wherein the bias circuit comprises an integrator that is configured to integrate a third signal and generate the bias voltage such that the bias voltage is an integrated version of the third signal, and wherein the third signal is derived from the second signal.

2. The circuit of claim 1, wherein when (i) a difference between the first supply voltage and the bias voltage is greater than or equal to a first threshold value and (ii) a difference between the bias voltage and the second supply voltage is greater than or equal to a second threshold value, the control circuit acts as a current-controlled inverter such that a current associated with the control circuit is controlled based on the bias voltage, wherein when the control circuit acts as the current-controlled inverter, the control circuit outputs the second signal as an inverted level-shifted version of the first signal, and wherein the first supply voltage is greater than the second supply voltage.

3. The circuit of claim 1, further comprising a functional circuit configured to receive a third supply voltage and a fourth supply voltage associated with the first voltage domain, and generate the first signal, wherein the functional circuit is coupled with the control circuit, and further configured to provide the first signal to the control circuit.

4. The circuit of claim 1, wherein the level shifter further comprises a set of inverters that is coupled with the control circuit and the bias circuit, and configured to receive the second signal, output a third signal such that a voltage range of the third signal is equal to a voltage range of the second signal, and provide the third signal to the bias circuit, and wherein the bias circuit generates the bias voltage that is indicative of a duty cycle of the third signal.

5. The circuit of claim 4, wherein the second signal is an inverted level-shifted version of the first signal, and the third signal has a same logic state as that of the second signal, and wherein a difference between the duty cycle of the third signal and the duty cycle of the second signal is less than a second tolerance limit associated with the level shifter.

6. The circuit of claim 4, wherein the level shifter further comprises an inverter that is coupled with the set of inverters, and configured to receive the third signal and output a fourth signal that is an inverted version of the third signal, wherein a voltage range of the fourth signal is equal to the voltage range of the third signal, and wherein a difference between a duty cycle of the fourth signal and an inverse of the duty cycle of the third signal is less than a third tolerance limit associated with the level shifter.

7. The circuit of claim 6, further comprising a functional circuit that is coupled with the inverter, and configured to receive the fourth signal and the first and second supply voltages and perform a set of functional operations associated therewith.

8. The circuit of claim 1, wherein the bias circuit comprises:
  a resistor and a capacitor that are configured to integrate a third signal and generate the bias voltage such that the bias voltage is an integrated version of the third signal, wherein the third signal is derived from the second signal; and
  a switch that is configured to receive a fourth signal, wherein the switch is activated and deactivated based on activation and deactivation of the fourth signal, respectively, and wherein when the switch is activated, the bias circuit provides the bias voltage to the control circuit.

9. The circuit of claim 8, wherein the switch is coupled between the resistor and the capacitor.

10. The circuit of claim 8, wherein the switch is coupled between the capacitor and the control circuit.

11. The circuit of claim 1, wherein the control circuit comprises:
  a first transistor that has a first terminal, a second terminal, and a third terminal, wherein the first terminal of the first transistor is configured to receive the first supply voltage, and the second terminal of the first transistor is coupled with the bias circuit, and configured to receive the bias voltage;

a second transistor that has (i) a first terminal coupled with the third terminal of the first transistor, (ii) a second terminal configured to receive the first signal, and (iii) a third terminal configured to output the second signal;

a third transistor that has a first terminal, a second terminal, and a third terminal, wherein the second terminal of the third transistor is coupled with the second terminal of the first transistor, and wherein the third terminal of the third transistor is coupled with the third terminal of the second transistor; and a fourth transistor that has (i) a first terminal configured to receive the second supply voltage, (ii) a second terminal coupled with the second terminal of the second transistor, and (iii) a third terminal coupled with the first terminal of the third transistor, wherein the first supply voltage is greater than the second supply voltage.

12. The circuit of claim 11, wherein the first transistor is deactivated when the bias voltage is equal to the first supply voltage, and the first transistor is activated when the difference between the first supply voltage and the bias voltage is greater than or equal to a first threshold value, and wherein the third transistor is deactivated when the bias voltage is equal to the second supply voltage, and the third transistor is activated when the difference between the bias voltage and the second supply voltage is greater than or equal to a second threshold value.

13. The circuit of claim 11, wherein when the first and third transistors are activated, a drive strength of the first transistor and a drive strength of the third transistor are controlled based on the bias voltage such that the difference between the duty cycle of the first signal and the inverse of the duty cycle of the second signal is less than the first tolerance limit.

14. The circuit of claim 11, wherein the level shifter further comprises a fifth transistor that has (i) a first terminal configured to receive the first supply voltage, (ii) a second terminal configured to receive a third signal, and (iii) a third terminal coupled with the bias circuit and the second terminals of the first and third transistors, wherein an operation of the level shifter is controlled based on the third signal, and wherein the fifth transistor is activated and deactivated based on deactivation and activation of the third signal, respectively.

15. The circuit of claim 14, wherein when the fifth transistor is activated, the bias voltage is equal to the first supply voltage, the first transistor is deactivated, and the third transistor is activated, wherein when the fifth transistor is deactivated, the bias voltage reduces such that the first transistor is activated when the difference between the first supply voltage and the bias voltage is greater than or equal to a first threshold value, and wherein when the first and third transistors are activated, the control circuit acts as a current-controlled inverter and outputs the second signal as an inverted level-shifted version of the first signal.

16. The circuit of claim 14, wherein when the fifth transistor is activated, the bias voltage is equal to the first supply voltage, the first transistor is deactivated, and the third transistor is activated, wherein when the fifth transistor is deactivated, the bias voltage is equal to the second supply voltage, the third transistor is deactivated, and the first transistor is activated, wherein when the fifth transistor remains deactivated, the bias voltage increases such that the third transistor is activated when the difference between the bias voltage and the second supply voltage is greater than or equal to a second threshold value, and wherein when the first and third transistors are activated, the control circuit acts as a current-controlled inverter and outputs the second signal as an inverted level-shifted version of the first signal.

17. The circuit of claim 14, wherein the level shifter further comprises a sixth transistor that has (i) a first terminal configured to receive the second supply voltage, (ii) a second terminal configured to receive a fourth signal that is an inverted version of the third signal, and (iii) a third terminal coupled with the third terminal of the second transistor, and configured to receive the second signal, wherein based on activation of the fourth signal, the sixth transistor is activated and the second signal is pulled down to the second supply voltage, and wherein based on deactivation of the fourth signal, the sixth transistor is deactivated.

18. A level shifting method, comprising:
receiving, by a control circuit of a level shifter, (i) a bias voltage, (ii) a first signal associated with a first voltage domain, and (iii) a first supply voltage and a second supply voltage associated with a second voltage domain;

outputting, by the control circuit, a second signal associated with the second voltage domain based on the bias voltage, the first and second supply voltages, and the first signal;

generating, by a bias circuit of the level shifter, the bias voltage that is indicative of a duty cycle of the second signal; and providing, by the bias circuit, the bias voltage to the control circuit, wherein the duty cycle of the second signal is controlled based on the bias voltage such that a difference between a duty cycle of the first signal and an inverse of the duty cycle of the second signal is less than a first tolerance limit associated with the level shifter, wherein the step of generating the bias voltage further comprises integrating, by an integrator of the bias circuit, a third signal that is derived from the second signal, and wherein the bias voltage is an integrated version of the third signal.

* * * * *